United States Patent [19]
Kiryu et al.

[11] Patent Number: 5,406,201
[45] Date of Patent: Apr. 11, 1995

[54] MAGNETIC FIELD DETECTING CIRCUIT HAVING A RELAXATION OSCILLATOR SQUID

[75] Inventors: Shogo Kiryu, Tsukuba; Nobuhiro Shimizu; Norio Chiba, both of Tokyo, all of Japan

[73] Assignees: Seiko Instruments Inc.; Agency Industrial Science and Technology, both of Japan

[21] Appl. No.: 967,723

[22] Filed: Oct. 28, 1992

[30] Foreign Application Priority Data

Nov. 7, 1992 [JP] Japan .................... 3-291792

[51] Int. Cl.⁶ .......................................... G01R 33/035
[52] U.S. Cl. ................................ 324/248; 505/846
[58] Field of Search .................. 324/248; 505/845, 846

[56] References Cited

U.S. PATENT DOCUMENTS 4,689,559  8/1987  Hastings et al. ............... 324/248
5,045,788  9/1991  Hayashi et al. ............... 324/248

OTHER PUBLICATIONS

Applied Physics A. Solids and Surfaces, vol. A47, No. 3, Nov. 1988, Berlin, Germany, pp. 285–289, M. Muck et al., "A Frequency-Modulated Read-Out System for DC SQUIDS".
Japanese Journal of Applied Physics, vol. 28, No. 3, Mar. 1989, Tokyo, Japan pp. 456–458, H. Furukawa et al., "Multichannel DC SQUID System".
IEEE Transactions on Magnetics, vol. MAG 15, No. 1, Jan. 1978, New York, US, pp. 474–477, J. N. Hollenhorst et al., "High Sensitivity Microwave SQUID".
Patent Abstracts of Japan, vol. 9, No. 308 (P-410) (2031) Dec. 4, 1985.
IBM Technical Disclosure Bulletin, vol. 32, No. 12, May, 1990, New York, US, pp. 93–94, "High Magnetic Field Resolution RF SQUID".

Primary Examiner—Walter E. Snow
Attorney, Agent, or Firm—Bruce L. Adams; Van C. Wilks

[57] ABSTRACT

A magnetic field detecting circuit has a relaxation oscillator SQUID. An oscillator circuit includes a coil and a resistor connected together in series. The oscillator circuit produces an output signal having an oscillating frequency dependent on an applied DC bias current. A magnetic field input circuit is magnetically coupled with the coil of the oscillator circuit for applying a magnetic field. A Josephson device is connected in parallel with the oscillator circuit for converting the magnetic field to an electric signal for varying the oscillating frequency dependent on the magnetic field. The magnetic field is detected by detecting a variation of the oscillating frequency. The sensitivity of the magnetic field detecting circuit is improved by magnetically coupling an RF-SQUID with an input coil to form the magnetic field input circuit. To provide a multi-channel magnetic field detecting circuit, a plurality of oscillator circuits are connected in series with each other, and a respective Josephson device is connected in parallel with each corresponding oscillator circuit. A plurality of magnetic field input circuits are each magnetically coupled with the coil of a respective oscillator circuit, and a plurality of control lines are magnetically coupled with each respective Josephson device to vary the critical current of the Josephson device to thereby control the oscillation frequency of each oscillator circuit.

4 Claims, 5 Drawing Sheets

MAGNETIC FIELD DETECTING CIRCUIT HAVING A RELAXATION OSCILLATOR SQUID

BACKGROUND OF THE INVENTION

The invention relates to a magnetic field detecting circuit using a Josephson device applied for a highly sensitive magnetic sensor, current meter, displacement detector, high-frequency signal amplifier and the like.

FIG. 2 is a circuit diagram of SQUID (RO-SQUID) where a resistor 2 and a coil 3 connected in series with each other are connected in parallel with a DC-SQUID 7. A magnetic field signal from a input coil 4 enters the DC-SQUID 7 to be converted into a critical current value, an oscillating frequency is shifted, and then a magnetic field is detected.

However, because the conventional RO-SQUID has the DC-SQUID 7 incorporated directly into the oscillator circuit a practical design must consider both the characteristics of oscillating condition of the RO-SQUID and a sensitivity of the DC-SQUID. This requires a complicated design and results in unsatisfactory sensitivity. A large inductance of the DC-SQUID arises in the above case increasing the difficulty of oscillation control from an external control line. Thus series connection for realizing the multi-channelization is impossible, and each channel must be connected independently for a plurality of channels. A problem arises because of the increases of the number of signal lines, resulting in cross talk between signal lines, and difficulty in carrying out accurate measurement.

SUMMARY OF THE INVENTION

It is an object of the present invention to provide a magnetic field detection circuit with a simple circuit design easier external oscillation control a satisfactory high sensitivity capability utilizing series connection of Josephson devices and easier multi-channelization of the magnetic field detecting circuit as compared with the prior art.

To achieve the foregoing object, this invention has a structure including a magnetic field input circuit magnetically coupled with a coil in a relaxation oscillator, so that an optimum design of the magnetic field detecting circuit is achieved independently for a parameter of the relaxation oscillator and a parameter of a receiving circuit of a magnetic field respectively. A control line for controlling an oscillation magnetically coupled with a Josephson device in the oscillator is added to enable a multi-channelization by a series connection of the Josephson devices.

In the magnetic field detecting circuit as described above, a signal is input from a magnetic field input circuit magnetically coupled with a coil of a relaxation oscillator oscillated by a bias current, and oscillating frequency is converted to detect a value of an inputted magnetic field. Through setting the bias current at a suitable value, a critical current value of the Josephson device is varied by a control line magnetically coupled to the Josephson device, thereby the control of the oscillation is available.

DETAILED DESCRIPTION OF THE PREFERRED-EMBODIMENTS

Embodiments according to the invention are described with reference to the drawings as follows.

Figure 1:
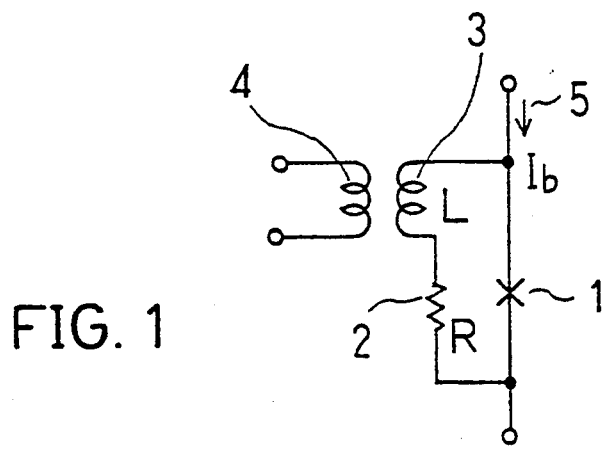
FIG. 1 is a circuit diagram of a first embodiment according to the present invention.

FIG. 1 is a circuit diagram of a first embodiment according to the invention. An oscillating frequency "f" generated across the Josephson device satisfies the following equation, $$f \approx (R/L)/(\ln\{(I_b - I_{cmin})/(I_b - I_{cmax})\})$$

where Ib represents a bias current 5 flowing into a circuit, Icmax and Icmin represent a maximum critical current and a minimum critical current of the Josephson device 1 respectively, L represents an inductance of a coil 3, and R represents a resistance of a resistor 2. When a magnetic flux enters to the coil 3 from an input coil 4, the oscillating frequency "f" is varied depending on an amount of the flux, the magnetic flux being detected as a frequency variation. An oscillation amplitude is of a gap voltage of the Josephson device with a constant value. Each device can easily be produced through the use of thin film and photolithography processes.

Figure 3:
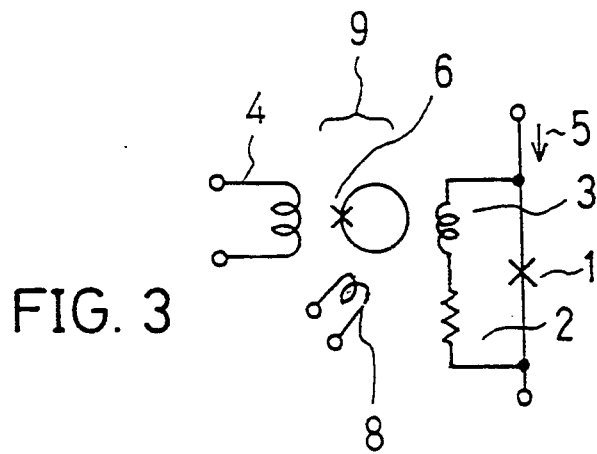
FIG. 3 is a circuit diagram of a second embodiment according to the present invention.

FIG. 3 shows a second embodiment according to the invention, where a higher sensitivity is provided as compared to the first embodiment by using an RF-SQUID 9 formed of the Josephson device 6 and a superconductive loop, and by a feedback coil 8 respectively, in addition to the input coil 4 as a magnetic field input circuit. In the second embodiment, a design can be performed separately for a parameter of the oscillating circuit and for a parameter of an RF-SQUID for detecting the magnetic field. This facilitates the design and an optimum highly sensitive design is obtained as compared to the conventional RO-SQUID.

Figure 4:
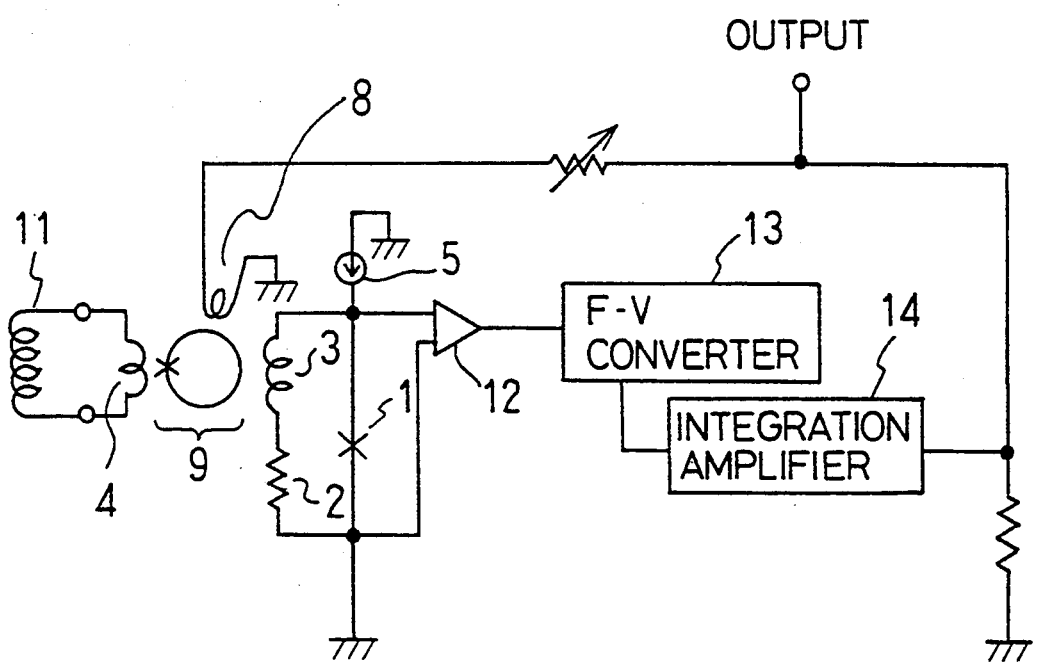
FIG. 4 is an embodiment of a magnetic field detecting system according to the present invention.

FIG. 4 is an example of a magnetic field detecting system according to the invention, where the RF-SQUID 9 is applied a feedback operation by a feedback coil 8 for obtaining a larger dynamic range. A magnetic field inputted from a detecting coil 11 enters the input coil 4 to be input to the coil 3 through the RF-SQUID 9, thus an oscillating frequency of a relaxation oscillator can be varied. Oscillation wave forms are converted into a DC voltage through a head amplifier 12 and an F-V converter 13, after which only an amount of variations of the frequency is taken out by an integration amplifier 14 as an output signal and a part of the output signal is fed back.

Figure 5:
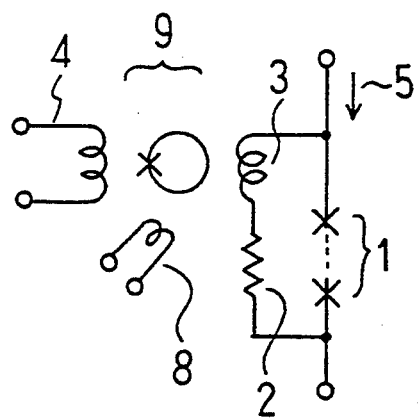
FIG. 5 is a circuit diagram of a third embodiment according to the present invention.

FIG. 5 shows a third embodiment according to the invention, showing a circuit in which a plurality of Josephson devices 1 of the second embodiment are connected in series with each other. Since an output of the relaxation oscillator is of a gap voltage of the Josephson device, the larger the number of those connected in series with each other produces a larger amplitude to facilitate detection of a signal. This method is applied to the circuit of the first embodiment.

Figure 6:
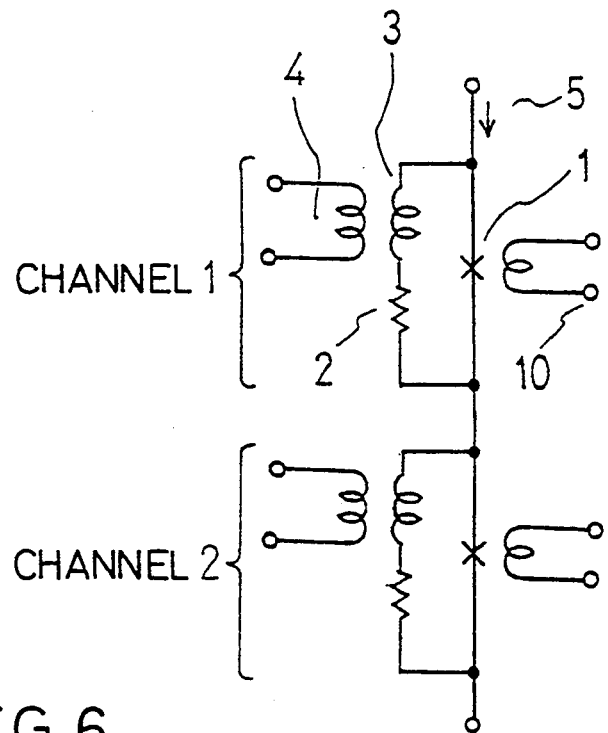
FIG. 6 is a circuit diagram of a fourth embodiment according to the present invention.

An embodiment obtaining multi-channelization according to the invention will be described as follows. In a circuit of the invention, more multi-channels can be easily obtained by connecting a plurality of relaxation oscillators in series with each other by being additionally applied with a control line 10 for controlling an oscillation that is magnetically coupled with the Josephson device 1. FIG. 6 is a circuit diagram of a fourth embodiment, where the circuit of the first embodiment in FIG. 1 is multi-channelized. Two of the same magnetic-field detecting circuits are connected in series with each other to form two channels. An oscillation condition is, $$Icmax < Ib < \{(Rn+R)/R\}Icmin$$

where Rn represents a normal conductive resistance of the Josephson device. When normally oscillating, a current is allowed to flow into the control line 10 to set a bias current 5 for obtaining Icmax <Ib. To turn OFF the oscillation, by reducing the current flowing into the control line 10 a value Icmax of the Josephson device 1 is raised to satisfy Icmax >Ib. According to the invention an oscillation of the circuit having multi-channels connected in series with each other is easily controlled by the current of the control line 10, thus a magnetic field of each channel can be detected by sequentially monitoring a frequency of a voltage output there across channel by channel. Wiring separately at every channel basis is not necessary, thus, the number of wirings can be reduced, cross talk between channels is prevented, and more accurate measurement is obtained.

Figure 2:
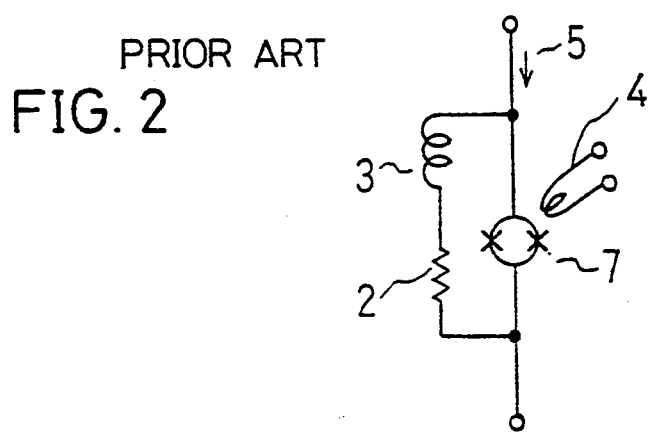
FIG. 2 is a conventional circuit diagram of the RO-SQUID.
Figure 7:
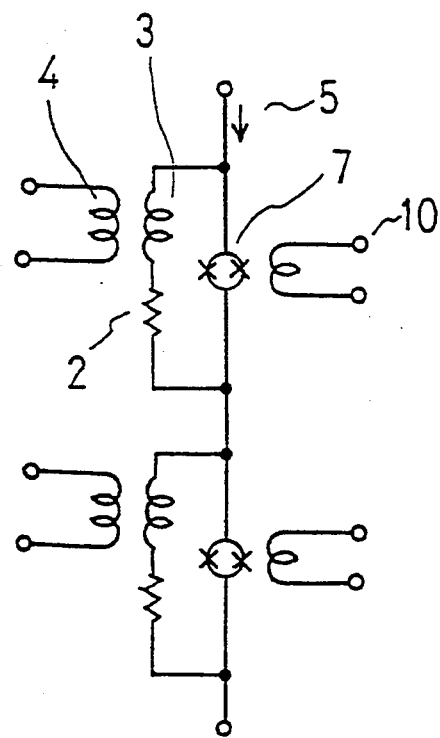
FIG. 7 is a circuit diagram of a fifth embodiment according to the present invention.

FIG. 7 shows a fifth embodiment according to the invention, where a circuit is incorporated with a DC-SQUID 7 instead of the Josephson device 1 of the fourth embodiment (FIG. 6). The DC-SQUID 7 provides an easier control of the oscillation due to a smaller inductance and a larger variation amount of Icmax because it controls only an oscillation that is different from the conventional example in Fig. 2.

Figure 8:
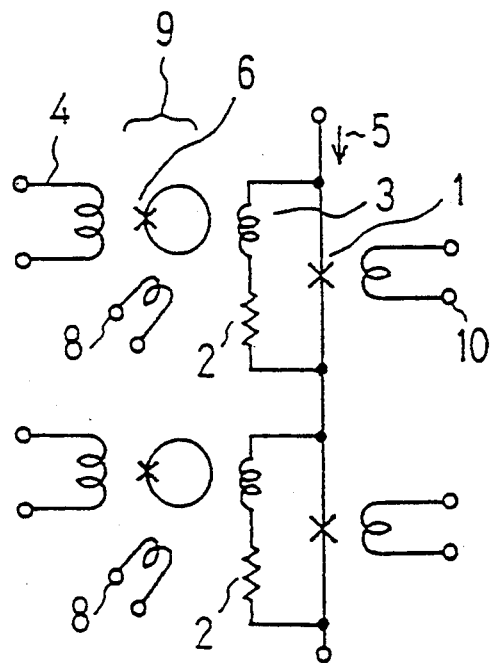
FIG. 8 is a circuit diagram of a sixth embodiment according to the present invention.

FIG. 8 shows a sixth embodiment according to the invention, where is illustrated an example of the multi-channelization of the second embodiment (FIG. 3).

Figure 9:
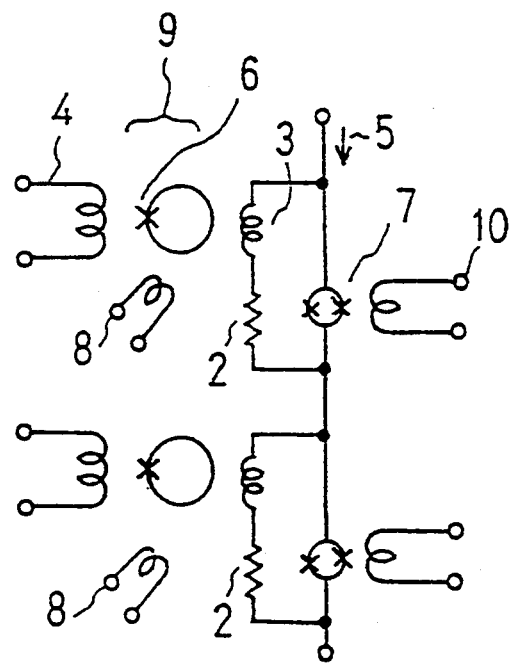
FIG. 9 is a circuit diagram of a seventh embodiment according to the present invention.

FIG. 9 shows a seventh embodiment according to the invention, where a circuit is incorporated with a DC-SQUID 7 instead of the Josephson device 1 of the sixth embodiment. The DC-SQUID 7 is the same as in the fifth embodiment (Fig. 7).

Figure 10:
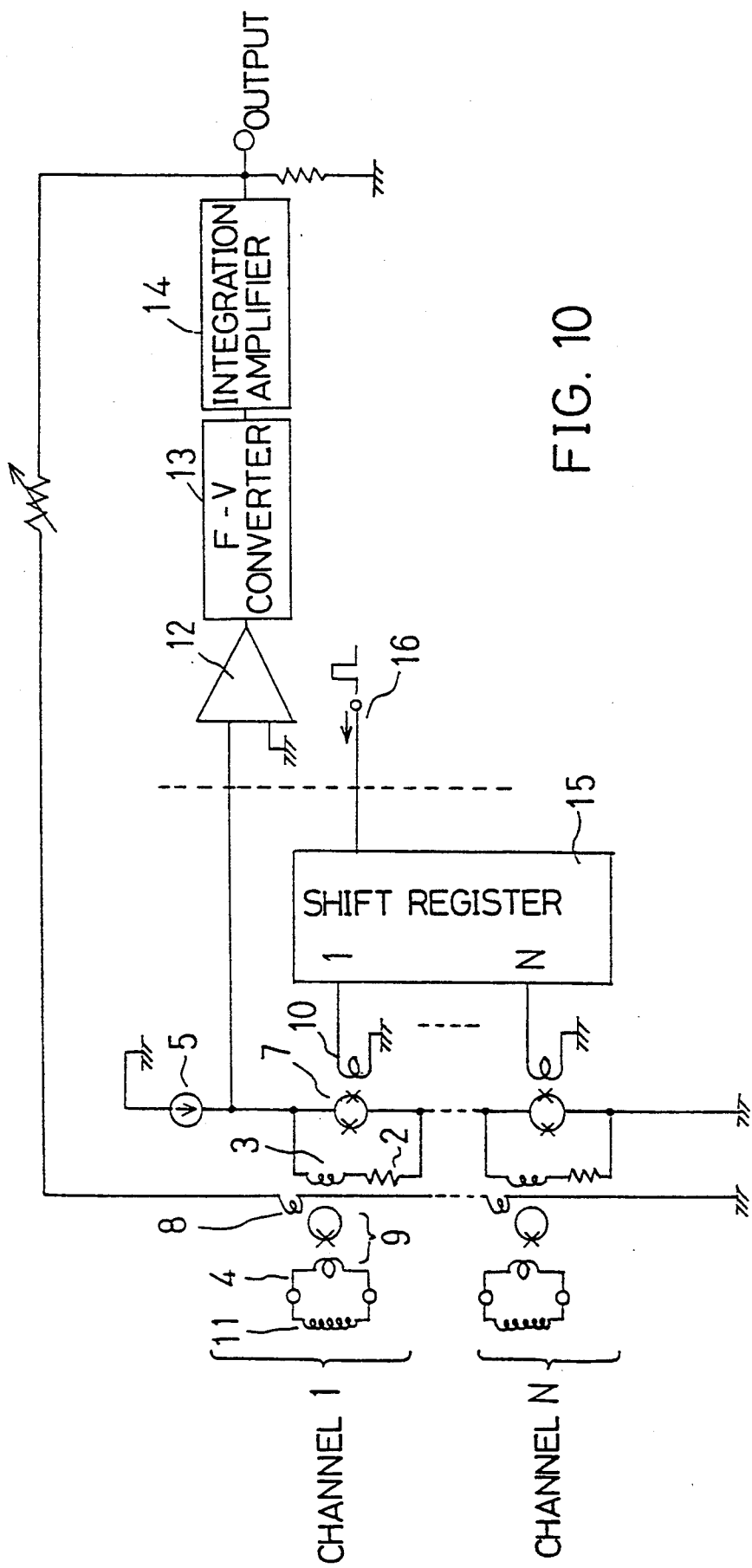
FIG. 10 is an embodiment of a multi-channel magnetic-field detecting system according to the present invention.

FIG. 10 shows an example of a multi-channel magnetic-field detecting system. A method of detecting a signal is the same as in FIG. 4, but there is added a shift register 15 in which the control line 10 for controlling the oscillation is controlled by an external clock signal 16. The shift register 15 can be produced by the superconductive circuit using the Josephson device, to be used in a superconductive state together with the magnetic field detecting circuit, and to be produced unitarily on the same substrate. In this system, an operation of each channel can be switched by the clock signal 16 to reduce the number of signal lines.

As hereinbefore fully described, according to the invention, the oscillations of multi-channel magnetic-field detecting circuits connected in series with each other can be controlled one channel at a time to detect a signal, and thus a magnetic field can be detected by less signal lines at a higher efficiency as compared with the conventional art. The embodiments have been shown and described for two channels, but more than two channels can be produced in a practical use.

According to the invention, as hereinbefore described, compared to the conventional RO-SQUID, an input of the magnetic field is carried out from the coil 3 of the relaxation oscillator, this provides an optimum design and an easier control of the oscillation by the control line. Therefore, a multi-channelization can be realized in a high efficiency, a cross talk between the channels is prevented, and a result is that a more sensitive detection of the magnetic field can be provided.

What is claimed is:

1. A magnetic field detecting circuit having an RO-SQUID, comprising:

an oscillator circuit having a coil and a resistor each connected in series with each other for generating a self-oscillating frequency while being supplied a DC current;

a Josephson device connected in parallel with said oscillator circuit for transducing a detected magnetic field to an electric signal; and a magnetic field input circuit magnetically coupled with said coil of said oscillator circuit for applying said detected magnetic field to said oscillator circuit, the magnetic field input circuit having an input coil, a feedback coil, and an RF-SQUID incorporated in a part of a super conductive ring, whereby the self-oscillating frequency is shifted corresponding to said detected magnetic field.

2. A magnetic field detecting circuit having an RO-SQUID according to claim 1, further comprising a plurality of said oscillator circuits connected in series with each other; a plurality of Josephson devices each connected in parallel with each of said oscillator circuits; a plurality of magnetic field input circuits each magnetically coupled with each of said oscillator circuits; and a plurality of control lines each magnetically coupled with each of said Josephson devices for varying a critical current of said Josephson devices to control a self-oscillating frequency of each of said oscillator circuits.

3. A magnetic field detecting circuit having a relaxation oscillator SQUID, comprising: an oscillator circuit comprising a coil and a resistor connected together in series for producing an oscillating output signal having an oscillating frequency dependent on an applied DC bias current; a magnetic field input circuit magnetically coupled with the coil for applying a magnetic field to the oscillator circuit, the magnetic field input circuit having an input coil magnetically coupled with an RF-SQUID connected with a superconductive loop and magnetically coupled with a feedback coil; and a Josephson device connected in parallel with the oscillator circuit for converting the magnetic field to an electric signal for varying the oscillating frequency dependent on the magnetic field, whereby the magnetic field is detected by detecting a variation of the oscillating frequency.

4. A magnetic field detecting circuit having a relaxation oscillator SQUID, comprising: a plurality of oscillator circuits connected in series with each other, each oscillator circuit comprising a coil and a resistor connected in series for producing an oscillating output signal having an oscillating frequency dependent on an applied DC bias current; a plurality of magnetic field input circuits each magnetically coupled with the coil of a respective oscillator circuit for applying a magnetic field thereto; a plurality of Josephson devices each connected in parallel with a respective oscillator circuit for converting the magnetic field applied thereto to an electric signal; and a plurality of control lines each magnetically coupled with a respective Josephson device to control an oscillation frequency of each corresponding oscillator circuit.

* * * * *